United States Patent
Ikuta

(10) Patent No.: US 8,329,524 B2
(45) Date of Patent: Dec. 11, 2012

(54) SURFACE EMITTING LASER, METHOD FOR PRODUCING SURFACE EMITTING LASER, AND IMAGE FORMING APPARATUS

(75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/413,973

(22) Filed: Mar. 7, 2012

(65) Prior Publication Data
US 2012/0171790 A1    Jul. 5, 2012

Related U.S. Application Data

(62) Division of application No. 12/837,039, filed on Jul. 15, 2010, now Pat. No. 8,188,487.

(30) Foreign Application Priority Data

Jul. 28, 2009   (JP) ................................. 2009-175390

(51) Int. Cl.
*H01L 33/06*    (2010.01)
(52) U.S. Cl. ................. 438/165; 257/79; 257/E33.011; 359/268

(58) Field of Classification Search ................. 438/165; 257/79, E33.011; 359/268
See application file for complete search history.

(56) References Cited

FOREIGN PATENT DOCUMENTS
CN    101111385 A    1/2008
CN    101950923 A    1/2011

*Primary Examiner* — Thanh V Pham
(74) *Attorney, Agent, or Firm* — Canon U.S.A., Inc. IP Division

(57) ABSTRACT

A surface emitting laser includes a lower multilayer mirror, an active layer, and an upper multilayer mirror stacked onto a substrate. A first current confinement layer having a first electrically conductive region and a first insulating region is formed above or below the active layer using a first trench structure. A second current confinement layer having a second electrically conductive region and a second insulating region is formed above or below the first current confinement layer using a second trench structure. The first and second trench structures extend from a top surface of the upper multilayer mirror towards the substrate such that the second trench structure surrounds the first trench structure. When the surface emitting laser is viewed in an in-plane direction of the substrate, a boundary between the first electrically conductive region and the first insulating region is disposed inside the second electrically conductive region.

5 Claims, 12 Drawing Sheets

SURFACE EMITTING LASER, METHOD FOR PRODUCING SURFACE EMITTING LASER, AND IMAGE FORMING APPARATUS

CROSS REFERENCE TO RELATED APPLICATIONS

This application is a Divisional of prior U.S. patent application Ser. No.: 12/837039 filed Jul. 15, 2010, which claims priority from Japanese Patent Application No. 2009-175390 filed Jul. 28, 2009, the disclosures of which are hereby incorporated by reference herein in their entirety.

BACKGROUND OF THE INVENTION

1. Field of the Invention

The present invention relates to a surface emitting laser, a method for producing a surface emitting laser, and an image forming apparatus.

2. Description of the Related Art

A vertical cavity surface emitting laser (VCSEL) is a surface emitting laser capable of emitting light in a direction perpendicular to a substrate surface and has a feature that a two-dimensional array can be easily formed.

Densification and high-speed operation can be realized by the parallel processing of a plurality of beams emitted from the two-dimensional array, and various industrial applications such as optical communication are expected. For example, when a surface emitting laser array is used as a light source for exposure of an electrophotographic printer, densification and high-speed operation can be achieved in a step of forming an image using a plurality of beams.

In such electrophotographic application, it is necessary to stably form very small laser spots on a photosensitive drum. Therefore, a stable operation in a single transverse mode or a single longitudinal mode is one of the required laser characteristics of a VCSEL.

In surface emitting lasers such as the above-referenced VCSEL, a method has been developed in which a current confinement structure is formed using a selective oxidation technique, so that current can be selectively injected into a region necessary to realize high performance.

In this method, an AlGaAs layer (e.g., $Al_{0.98}Ga_{0.02}As$) having a high aluminum (Al) composition ratio is provided in a multilayer mirror; and this AlGaAs layer is selectively oxidized in a high-temperature water vapor atmosphere to form the current confinement structure. Since the oxidized region is changed from an electrically conductive region to an insulating region, current can be selectively injected into a desired position of an active layer region.

In order to achieve a high output in such a selective oxidation-type VCSEL, it is necessary to increase the diameter of an aperture serving as an electrically conductive region of the current confinement structure. However, the distribution of carriers, which carry the current, is concentrated on an edge portion of the aperture, the edge portion being a boundary between the electrically conductive region and an insulating region. Accordingly, when the diameter of the aperture is increased, a higher-order transverse mode, which has a large light intensity distribution in the edge portion, tends to oscillate.

To solve this problem, H. J. Unold et al., in "Large-Area Single-Mode Selectively Oxidized VCSELs: Approaches and Experimental", Proceedings of SPIE Photon, West, Vol. 3946, (2000), pp. 207-218, (hereafter "Non-Patent Document 1"), discloses a method in which two current confinement structures are used. FIG. 10(b) of Non-Patent Document 1 has been reproduced as FIG. 12 herein.

In the method of Non-Patent Document 1, in which two current confinement structures are used, a current confinement structure 1230 having an aperture diameter smaller than the aperture diameter of another current confinement structure 1220 which is disposed near an active layer 1210 is arranged at the side that is away from the active layer. With this structure, carriers are concentrated on the central portion of the aperture in the current confinement structure 1220 disposed nearer to the active layer 1210. The current confinement structure 1220 disposed nearer to the active layer 1210 dominates the mode of resonant light. Accordingly, when the carriers are injected into the central portion of the aperture, the coupling efficiency between the carriers and fundamental mode light can be increased. Similarly, when two current confinement structures are used, oscillation in a higher-order mode can be suppressed and a high-output surface emitting laser can be obtained, as compared with the case where one current confinement structure is used.

To achieve a single transverse mode, it is necessary to perform an effective coupling between carriers and the fundamental mode light. For this purpose, in the technology disclosed in Non-Patent Document 1 in which two current confinement structures are provided, it is necessary that the aperture diameter of the current confinement structure 1230 disposed at the side that is away from the active layer 1210 be smaller than the aperture diameter of the current confinement structure 1220 disposed at the side near the active layer 1210.

For example, when the aperture diameter of the current confinement structure 1220 disposed at the side near the active layer 1210 is in the range of 6 to 7 μm, the aperture diameter of the current confinement structure 1230 disposed at the side that is away from the active layer 1210 is about a half of that of the current confinement structure 1220, i.e., in the range of about 3 to 4 μ.

In the normal mesa structure described in Non-Patent Document 1, in preparation of an oxidation current confinement structure having a small diameter, it is necessary to perform oxidation from a sidewall of the mesa over a long distance in a transverse direction. In contrast, the preparation of an oxidation current confinement structure having a large diameter requires oxidation from the sidewall of the mesa, but only over a short distance in the transverse direction.

However, according to empirical facts, with an increase in the oxidation distance, it becomes difficult to control the oxidation process and the probability in which the oxidation distance does not match with a design value increases, resulting in a decrease in the yield. In addition, when the oxidation distance increases, the resulting oxidized layer tends to be detached from adjacent semiconductor layers during an annealing treatment or during current injection, resulting in a decrease in the reliability of the resulting device.

SUMMARY OF THE INVENTION

The present invention provides a surface emitting laser including a plurality of current confinement structures in which a preparation error is small and the reliability of a device can be ensured, and a method for producing the same.

A surface emitting laser according to an embodiment of the present invention includes a substrate; a lower multilayer mirror; an active layer; and an upper multilayer mirror, the lower multilayer mirror, the active layer, and the upper multilayer mirror being provided on the substrate in that order. The surface emitting laser further includes a first current confinement layer including a first electrically conductive region and a first insulating region and provided between layers constituting the upper multilayer mirror or between the upper multilayer mirror and the active layer; a second current confinement layer including a second electrically conductive region and a second insulating region and provided at a position closer to the active layer than the first current confinement layer; a first trench structure for forming the first insulating region, the first trench structure extending from the top of the upper multilayer mirror towards the substrate; and a second trench structure for forming the second insulating region, the second trench structure extending from the top of the upper multilayer mirror towards the substrate so as to surround the first trench structure and having a bottom located at a position deeper than a bottom of the first trench structure. In the surface emitting laser, a boundary between the first electrically conductive region and the first insulating region is disposed inside the second electrically conductive region in an in-plane direction of the substrate.

According to the present invention, it is possible to provide a surface emitting laser including a plurality of current confinement structures in which a preparation error is small and the reliability of a device can be ensured, and a method for producing the same.

Further features of the present invention will become apparent from the following description of exemplary embodiments with reference to the attached drawings.

DESCRIPTION OF THE EMBODIMENTS

First Embodiment

Figure 1A:
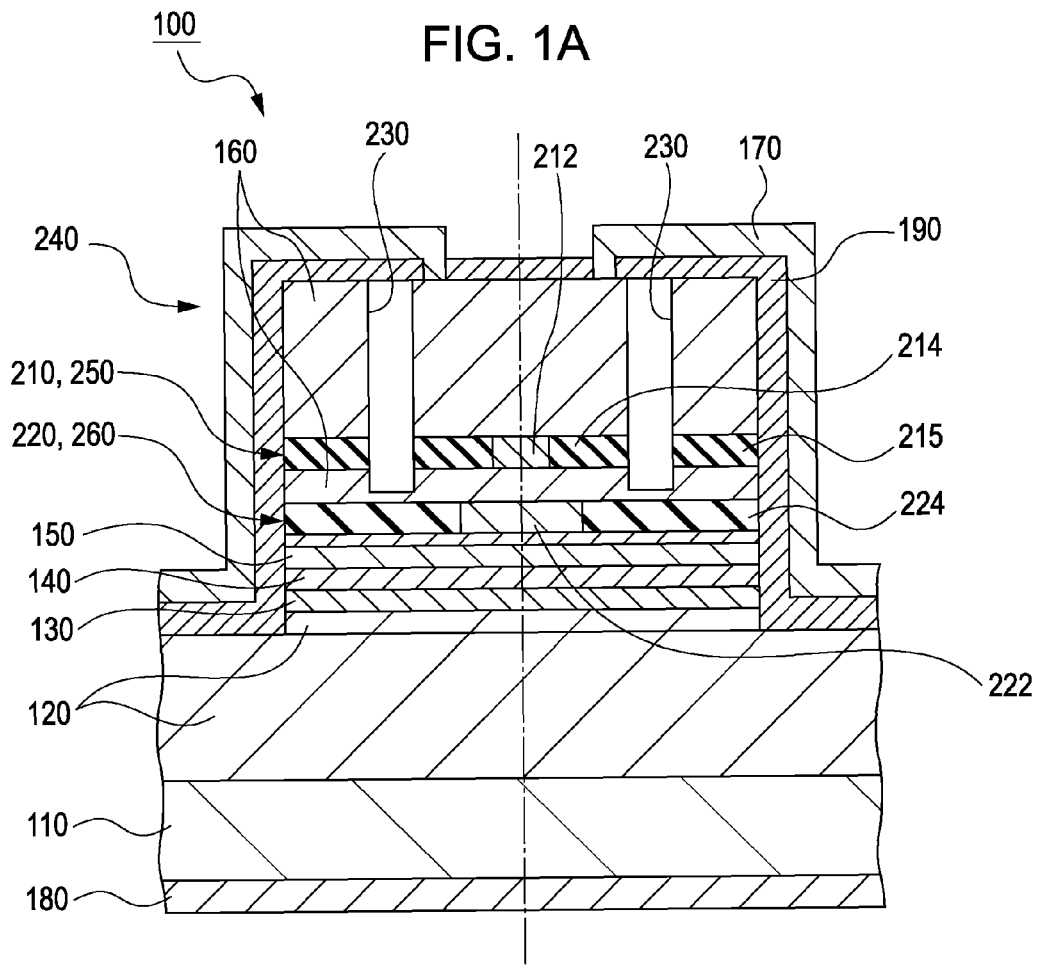
FIGS. 1A and 1B are schematic views each showing a surface emitting laser according to a first embodiment.
Figure 1B:
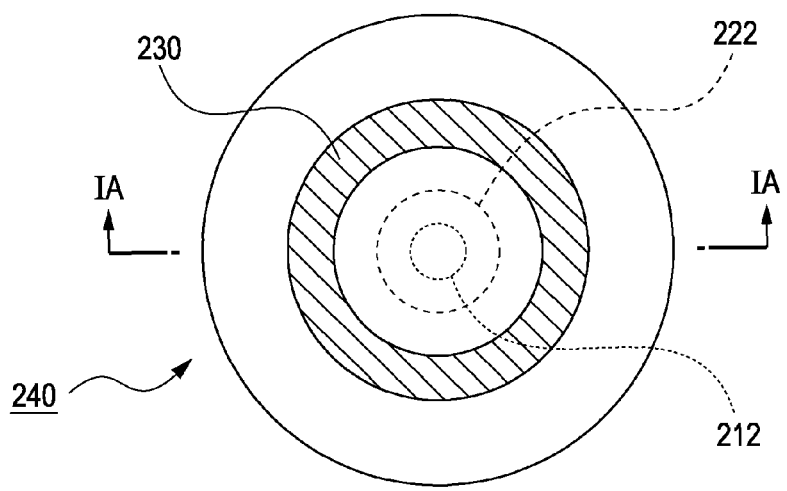

FIG. 1A is a schematic cross-sectional view of a surface emitting laser 100 according to a first embodiment of the present invention, and FIG. 1B is a schematic top view of the surface emitting laser 100. Specifically, FIG. 1A is a cross-sectional view taken along line IA-IA in FIG. 1B.

A lower multilayer mirror 120, a lower spacer layer 130, an active layer 140, an upper spacer layer 150, and an upper multilayer mirror 160 are stacked on a substrate 110 in that order to form a laser cavity in a direction perpendicular to a substrate surface. Carriers (electrons or holes-depending on the type of doping) are injected from an upper electrode 170 provided on the upper multilayer mirror 160 and a lower electrode 180 provided below the substrate 110 into the active layer 140. The active layer 140 emits light, thus leading to the oscillation of the surface emitting laser 100.

A first current confinement layer 210 is provided in the upper multilayer mirror 160. The first current confinement layer 210 includes a first electrically conductive region 212 and first insulating regions 214 and 215 and has a function of injecting current into the central portion of the active layer 140.

A second current confinement layer 220 is provided at a position closer to the active layer 140 than the first current confinement layer 210. For example, the second current confinement layer 220 is provided between the first current confinement layer 210 and the active layer 140. The second current confinement layer 220 includes a second electrically conductive region 222 and a second insulating region 224 and has a function of dominating the mode of resonant light.

In this embodiment, the first current confinement layer 210 and the second current confinement layer 220 are provided above the active layer 140. Alternatively, the second current confinement layer 220 may be provided below the active layer 140. In this embodiment, the first current confinement layer 210 is provided in the upper multilayer mirror 160, but the first current confinement layer 210 need not be necessarily provided in the upper multilayer mirror 160. In addition, it should be noted that the denomination of "first" and "second" layers is used in this specification for purposes of convenience only. As long as at least two confinement layers exist (with both layers on the same side-or one layer on each side-of the active layer), it does not matter the order in which the layers are denominated.

A first trench structure 230 extends from the top surface of the upper multilayer mirror 160 to at least the top surface of the first current confinement layer 210, but does not reach the top surface of the second current confinement layer 220. In other words, the bottom of the first trench structure 230 is located immediately above the second current confinement layer 220, but it does not reach the top surface of the second current confinement layer 220. In the first containment layer 210, a semiconductor layer facing the first trench structure 230 is oxidized from an inner sidewall of the first trench structure 230 towards the center thereof, so as to form the first insulating region 214. Similarly, in the first containment layer 210, the semiconductor layer contained between the first trench structure 230 and a second trench structure 240 is oxidized from an outer sidewall of the first trench structure 230 towards an inner sidewall of the second trench structure 240, so as to form the first insulating region 215. It should be noted that as the first trench structure 230 extends from the top surface of the upper multilayer mirror 160, it may stop at the center of the first current confinement layer 210 or it may penetrate through the first current confinement layer 210, but it does not reach the top surface of the second current confinement layer 220.

The second trench structure 240 is provided so as to extend from the top surface of the upper multilayer mirror 160 and to surround the first trench structure 230. In other words, the second trench structure 240 is concentric to the first trench structure 230. It should be noted that as the second structure 240 extends from the top surface of the upper multilayer mirror 160, the second trench structure 240 penetrates through the first current confinement layer 210 and reaches at least the top surface of the second current confinement layer 220. More specifically, the bottom of the second trench structure 240 is located at a position deeper than the bottom of the first trench structure 230. In the second current confinement layer 220, a semiconductor layer facing the second trench structure 240 is oxidized from an inner sidewall of the second trench structure 240 towards the center thereof, so as to form the second insulating region 224. Note that the second trench structure 240 may stop at the center of the second current confinement layer 220 or may penetrate through the second current confinement layer 220.

As described above, since the surface emitting laser 100 of this embodiment includes the first trench structure 230 and the second trench structure 240, the upper multilayer mirror 160 is present between the second trench structure 240 and the first trench structure 230.

When this surface emitting laser 100 is viewed from above, as shown in FIG. 1B, the size of the first electrically conductive region 212 is smaller than that of the second electrically conductive region 222, and the boundary between the first electrically conductive region 212 and the first insulating region 214 is present inside the second electrically conductive region 222. That is, in the first embodiment, when viewed from above, the boundary between the first electrically conductive region 212 and the first insulating region 214 overlaps with the second electrically conductive region 222.

Note that such a state may be described that "when viewed in an in-plane direction of the substrate 110, the boundary between the first electrically conductive region 212 and the first insulating region 214 is arranged inside the second electrically conductive region 222".

In the first current confinement layer 210 of this embodiment, the first insulating region 214 provided between the first electrically conductive region 212 and the first trench structure 230 is formed by oxidizing a predetermined volume of the first current confinement layer 210 from the sidewall of the first trench structure 230 towards the center thereof in a transverse direction. The first insulating region 215 provided between the first trench structure 230 and the second trench structure 240 is formed by oxidizing the volume of the first current confinement layer 210 from the sidewall of the second trench structure 240 to the sidewall of the first trench structure 230 in a transverse direction.

In contrast, in Non-Patent Document 1, the current confinement structures 1230 or 1220, corresponding to the first insulating regions 214 and 215 constituting a current confinement structure having a small aperture diameter, are all oxidized from the sidewall of the mesa, corresponding to the second trench structure 240.

That is, according to this embodiment of the present invention, the first trench structure 230 is provided inside of, and separately from, the second trench structure 240, and a current confinement structure having a small aperture diameter is formed by using this first trench structure 230. Therefore, the first electrically conductive region 212 serving as an aperture can be formed with an oxidation distance much shorter than that in Non-Patent Document 1.

When the oxidation distance is short, the oxidation time is also short. Thus, reaction by-products due to oxidation do not tend to accumulate. For example, in oxidation of an AlGaAs layer, an arsenic (As) residue is produced in, for example, an oxidation front (a boundary between an oxidized region (insulating region) and an unoxidized region (electrically conductive region)) as the oxidation proceeds. This arsenic (As) residue causes a reaction such as sublimation during an annealing treatment or during current injection, and such a reaction may result in damage to the resulting device. For example, it may result in detachment of the oxidized layer.

On the other hand, in the structure according to this embodiment, since the oxidation distance in the first current confinement layer 210 can be reduced as compared with the technique described in Non-Patent Document 1, degradation of the device during an annealing treatment or during current injection can be suppressed.

Note that the term "oxidation distance" refers to the minimum distance between an oxidation front and a sidewall of a trench structure to which an oxidized region extending from the oxidation front is exposed.

In general, variations in the oxidation distance in a wafer and variations in the oxidation distance in processes are proportional to the length of the oxidation distance. Accordingly, in the technique of this embodiment in which the oxidation distance can be reduced, variations from a design value can be reduced to improve the yield in the preparation of the device.

Considering the coupling between the carrier distribution and the distribution of the intensity of fundamental mode light, for example, the diameter of the first electrically conductive region 212 is preferably about a half of the diameter of the second electrically conductive region 222. In order to control the variation proportion of the oxidation distances in the respective current confinement layers to be uniform, the oxidation distance of the first current confinement layer 210 is preferably about a half of the oxidation distance of the second current confinement layer 220.

The current density of the first current confinement layer 210 is higher than the current density of the second current confinement layer 220. Therefore, the oxidation distance of the first current confinement layer 210 is preferably shorter than the oxidation distance of the second current confinement layer 220.

In the surface emitting laser 100 of the first embodiment, the second electrically conductive region 222 substantially functions as a light-emitting region. Therefore, if the first trench structure 230 is disposed inside the second electrically conductive region 222 in the in-plane direction of the substrate 110, the resonant mode of a laser suffers scattering loss, resulting in an increase in the oscillation threshold. For this reason, the first trench structure 230 is preferably disposed outside the second electrically conductive region 222 in the in-plane direction of the substrate 110. In other words, when viewed in an in-plane direction of the substrate 110, the first trench structure 230 is arranged outside the second electrically conductive region 222.

Next, a specific structure of the surface emitting laser according to this embodiment and a method for producing the surface emitting laser including a substrate and a laminate stacked on the substrate will be described.

The substrate 110 is, for example, an n-type doped GaAs substrate. The laminate including a lower multilayer mirror 120, an active layer 140, and an upper multilayer mirror 160 provided above (stacked on) the substrate 110 can be formed in stages using known fabrication methods. An n-type lower multilayer mirror 120 is formed on the substrate 110 by alternately stacking, for example, $Al_{0.9}Ga_{0.1}As$ layers each having an optical thickness of $\lambda/4$ and $Al_{0.5}Ga_{0.5}As$ layers each having an optical thickness of $\lambda/4$. For example, the number of pairs of the high-refractive-index layer and the low-refractive-index layer is 70. Here, $\lambda$ represents a resonant wavelength of the laser cavity, and is, for example, 680 nm in terms of the vacuum wavelength.

An active layer 140 composed of, for example, AlGaInP, more specifically, an active layer 140 that includes a multiquantum well structure composed of GaInP/AlGaInP and having an emission peak at λ=680 nm is formed above the lower multilayer mirror 120 by crystal growth. With respect to the emission peak of the active layer, detuning may be performed so that the emission peak is shifted to the short-wavelength side or the long-wavelength side relative to the oscillation wavelength in consideration of the temperature change or the like in actual driving conditions. A lower spacer layer 130 and an upper spacer layer 150 for adjusting the phase of the laser cavity are respectively formed on the lower side and the upper side of the active layer 140. The sum of the optical thicknesses of the lower spacer layer 130, the active layer 140, and the upper spacer layer 150 is an integral multiple of $\lambda/2$ and is $\lambda$, for example.

A p-type upper multilayer mirror 160 is formed above the active layer 140 by crystal growth. The upper multilayer mirror 160 includes, for example, 40 pairs of an $Al_{0.9}Ga_{0.1}As$ layer having a thickness of $\lambda/4$ and an $Al_{0.5}Ga_{0.5}As$ layer having a thickness of $\lambda/4$, the $Al_{0.9}Ga_{0.1}As$ layers and the $Al_{0.5}Ga_{0.5}As$ layers being alternately stacked. A part of the upper multilayer mirror 160 is replaced with an AlGaAs layer having an Al composition ratio higher than that of the AlGaAs layers forming the pairs of the upper multilayer mirror 160, and the replaced part of the layer is used as an oxidizable layer. A current confinement layer including an oxidized insulating region and an unoxidized electrically conductive region is formed by oxidizing a part of the oxidizable layer. For example, when two portions in the upper multilayer mirror 160 are used as such oxidizable layers, a second oxidizable layer 260 and a first oxidizable layer 250 are arranged at positions of the upper multilayer mirror 160, the positions corresponding to the first pair and the sixth pair numbered from the active layer 140, respectively. However, the present invention is not limited to this configuration. For example, the first oxidizable layer 250 may be disposed inside the upper multilayer mirror 160 and the second oxidizable layer 260 may be disposed inside the lower multilayer mirror 120.

An AlGaAs layer can be used as each of the oxidizable layers. For example, $Al_xGa_{1-x}As$ ($0.95 \leq x \leq 1$) is easily oxidized by, for example, heating to 300° C. or higher and exposing to water vapor, and becomes an insulator containing an aluminum (Al) oxide. Thus, the first oxidizable layer 250 may be composed of, for example, $Al_{0.98}Ga_{0.02}As$ having a thickness of 15 nm, and the second oxidizable layer 260 may be composed of, for example, AlAs having a thickness of 30 nm.

Peripheral layers of the first oxidizable layer 250 and second oxidizable layer 260 may be high-refractive-index layers (e.g., $Al_{0.5}Ga_{0.5}As$) or low-refractive-index layers (e.g., $Al_{0.9}Ga_{0.1}As$) forming the upper multilayer mirror 160. Alternatively, the peripheral layers may be graded layers (in which the composition ratio continuously changes from $Al_{0.9}Ga_{0.1}As$ to $Al_{0.5}Ga_{0.5}As$, for example).

The top layer of the upper multilayer mirror 160 is a semiconductor contact layer for contacting the upper electrode 170. The semiconductor contact layer is, for example, a GaAs layer having a thickness of 20 nm.

Crystal growth of the laminate described above may be conducted by metal organic chemical vapor deposition (MOCVD).

In the above embodiment, an example has been described in which the first insulating region 215 is provided. However, in the first current confinement layer 210, an electrically conductive region may be present outside the first trench structure 230 (between the first trench structure 230 and the second trench structure 240). This is because, for example, in the case where the first trench structure 230 has a ring shape and the contact between the upper multilayer mirror 160 and the upper electrode 170 is limited to the inside of the first trench structure 230, even if such an electrically conductive region is present, carriers do not flow the region.

On the other hand, when the first trench structure 230 is not closed and has an intermittent structure when viewed from the upper portion of the device, the electrically conductive region in the first current confinement layer 210 may be limited to the first electrically conductive region 212 only. Specifically, when the inside portion and the outside portion of the first trench structure 230 are in a conductive state in a part of the upper multilayer mirror 160, the part being located higher than the first current confinement layer 210, the first insulating region 215 may be provided.

Also, when the contact between the upper multilayer mirror 160 and the upper electrode 170 is also present outside the first trench structure 230, it is desirable to provide the first insulating region 215. This is because, in the first current confinement layer 210, the distribution of carriers passing through an electrically conductive region other than the first electrically conductive region 212 does not necessarily contribute to the operation in a single transverse mode.

A semiconductor process that is schematically shown in FIGS. 3A to 5P is conducted on a wafer having the above layer structure. The process described below is a self-alignment process in which the alignment of the first trench structure 230 and the alignment of the second trench structure 240 are performed at the same time. In addition, the process described below is a process in which oxidation of the first oxidizable layer 250 and oxidation of the second oxidizable layer 260 are performed at different timings. Specifically, a step of oxidizing the first oxidizable layer 250 is conducted prior to a step of oxidizing the second oxidizable layer 260.

Figure 3A:
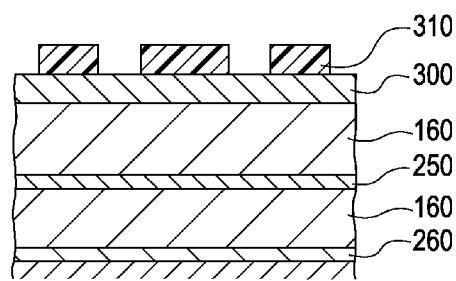
FIGS. 3A to 3F are schematic views each showing a method for producing the surface emitting laser according to the first embodiment.

First, as shown in FIG. 3A, a first dielectric layer 300 functioning as a protective film is deposited on the upper multilayer mirror 160. The first dielectric layer 300 is a silicon oxide (e.g., $SiO_2$) layer having a thickness of, for example, 1 μm. For example, a plasma CVD method can be employed as a deposition method.

A photoresist 310 is applied onto the first dielectric layer 300, and patterned and developed so that an opening pattern is formed at positions of the first trench structure 230 and the second trench structure 240.

The first trench structure 230 has a concentric ring shape having, for example, an inner diameter (diameter) of 14 μm and an outer diameter (diameter) of 20 μm. The second trench structure 240 has, for example, an inner diameter (diameter) of 27 μm. The outer diameter of the second trench structure 240 is, for example, 33 μm or more. The outer diameter of the second trench structure 240 is not shown in the figure.

Figure 3D:
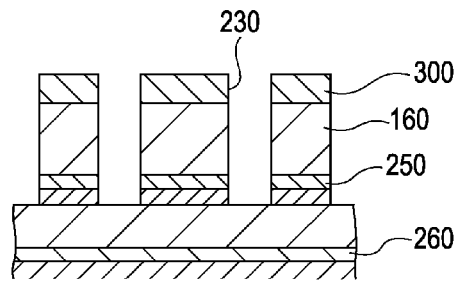
Figure 3B:
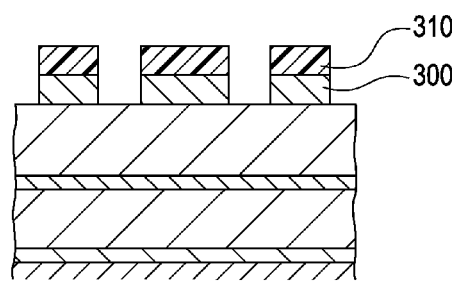

Next, as shown in FIG. 3B, the first dielectric layer 300 functioning as the protective film is etched using the patterned photoresist 310 as a mask. The etching may be wet etching using, for example, buffered hydrogen fluoride (BHF) or dry etching using, for example, $CHF_3$ gas plasma.

Figure 3E:
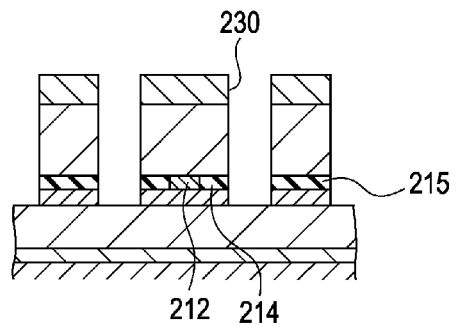
Figure 3C:
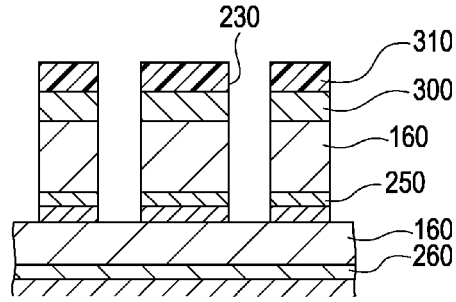

Next, as shown in FIG. 3C, the semiconductor layer is dry-etched using the photoresist 310 and the first dielectric layer 300 as a mask to form the first trench structure 230 and the second trench structure 240. In this step, the etching for forming the first trench structure 230 and the second trench structure 240 is conducted so as not to reach the top surface of the second oxidizable layer 260. The dry etching is conducted using, for example, plasma of $SiCl_4$ gas and Ar gas.

Next, as shown in FIG. 3D, the photoresist 310 remaining on the first dielectric layer 300 is removed. The photoresist 310 is removed by, for example, asking using oxygen plasma.

Next, as shown in FIG. 3E, the first oxidizable layer 250 is oxidized from exposed sidewalls in the first trench structure 230 and the second trench structure 240, thus forming the first insulating regions 214 and 215. The oxidation is conducted by heating the substrate to, for example, 450° C. and exposing the substrate to water vapor. The oxidized first oxidizable layer 250 becomes an insulator containing a polycrystalline or amorphous aluminum (Al) oxide as a main component.

The oxidation is conducted so that an unoxidized region, namely, the first electrically conductive region 212 is left at the central portion of the first oxidizable layer 250.

Figure 2:
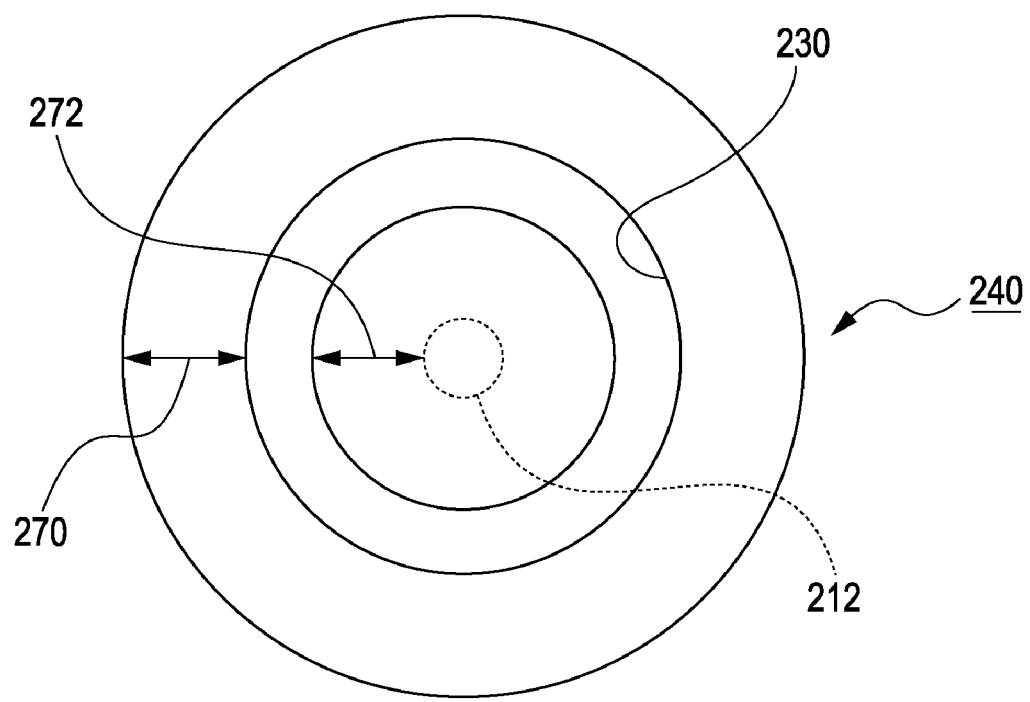
FIG. 2 is a schematic view showing the surface emitting laser according to the first embodiment.

In order to oxidize the whole first oxidizable layer 250 except for the first electrically conductive region 212, which is present at the central portion thereof, as shown in FIG. 2, a distance 270 between the first trench structure 230 and the second trench structure 240 is preferably two times an oxidation distance 272 or less.

Since the first oxidizable layer 250, which is disposed between the first trench structure 230 and the second trench structure 240, is oxidized from the sidewalls of the two trench structures, the possibility of oxidizing the whole first oxidizable layer 250 is increased by satisfying the above condition.

The first electrically conductive region 212 has a circular shape having a diameter of, for example, 4 μm. In this case, the distance between the inner circumference of the first trench structure 230 and the boundary between the first electrically conductive region 212 and the first insulating region 214, i.e., the oxidation front is 5 μm, and therefore, the oxidation distance is 5 μm. On the other hand, the distance between the outer circumference of the first trench structure 230 and the inner circumference of the second trench structure 240 is 3.5 μm.

Figure 3F:
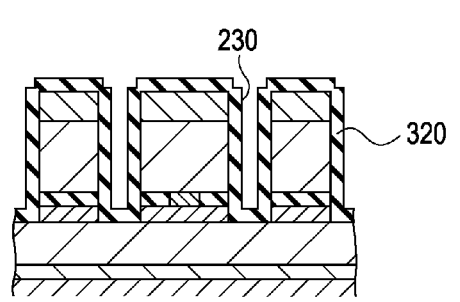

Next, as shown in FIG. 3F, an additional protective film 320 that is thinner than the initial protective film (i.e., first dielectric layer) 300 deposited in the previous step is deposited. The thin protective film 320 is a second dielectric layer having a thickness of, for example, 100 nm and composed of, for example, silicon oxide.

Note that the step of depositing the additional protective film 320 may be omitted. That is, in oxidizing the second oxidizable layer 260, the sidewalls of the first oxidizable layer 250 are exposed in the first trench structure 230. However, oxidation hardly proceeds again from the portions that have been oxidized, and thus the additional protective film 320 is not essential. In particular, when the substrate temperature in the oxidation of the second oxidizable layer 260 may be lower than the substrate temperature in the oxidation of the first oxidizable layer 250, the additional protective film 320 need not be provided. Furthermore, even in the case where oxidation hardly proceeds, a buffered hydrogen fluoride-resistant film is formed on the sidewall surfaces of AlGaAs exposed to high-temperature water vapor, and thus the surfaces may be intentionally exposed in some cases.

Figure 4G:
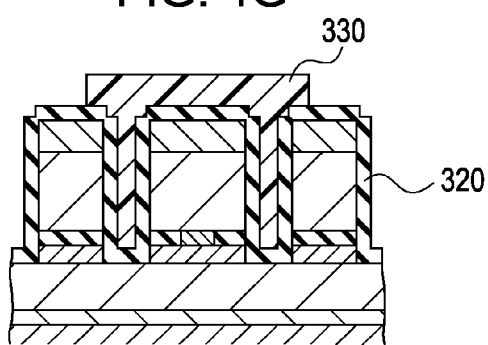
FIGS. 4G to 4L are schematic views each showing the method for producing the surface emitting laser according to the first embodiment.

Next, as shown in FIG. 4G, a photoresist 330 is applied, and patterning exposure and development are then conducted so as to form a resist that covers the first trench structure 230 and that does not cover the second trench structure 240. Since the first trench structure 230 is not connected to the second trench structure 240 and the upper multilayer mirror 160 is present between these trench structures, a boundary of the patterning of the resist can be located on this position of the upper multilayer mirror 160. When such an upper multilayer mirror 160 is not provided, the inner circumference of the second trench structure 240 is determined by the patterning of the resist in this step. Accordingly, the self-alignment process cannot be performed.

Figure 4J:
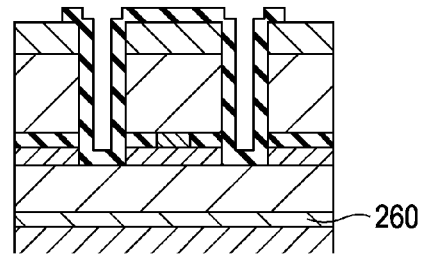
Figure 4H:
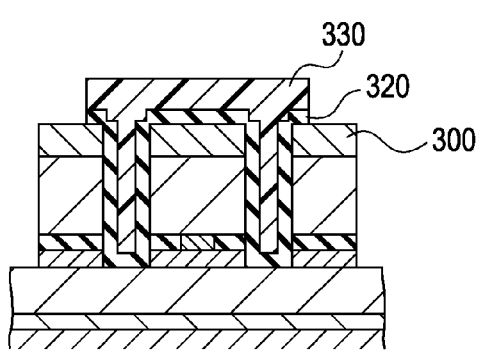

As shown in FIG. 4H, the thin protective film 320 is etched using this photoresist 330 as a mask to expose a semiconductor surface on the bottom of the second trench structure 240. The etching is conducted by, for example, immersing in buffered hydrogen fluoride for about one minute.

Figure 4K:
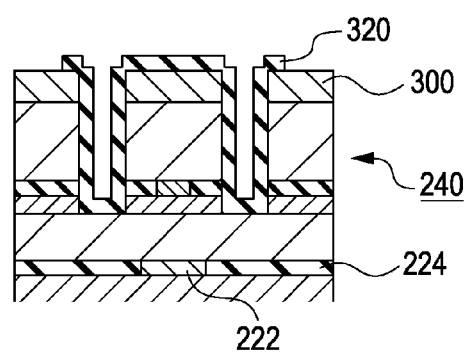
Figure 4I:
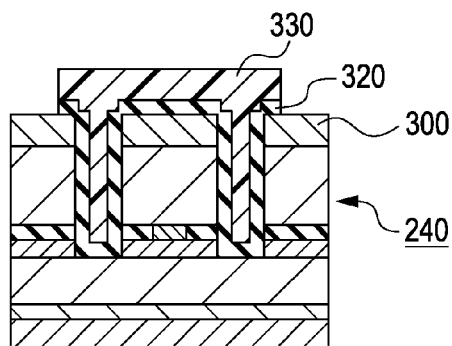

Next, as shown in FIG. 4I, etching of the second trench structure 240 is conducted using the photoresist 330, the protective film 320, and the first dielectric layer 300 as a mask. The etching is conducted until at least the top surface of the second oxidizable layer 260 is exposed. The etching is conducted by, for example, dry etching using plasma of $SiCl_4$ gas and Ar gas. For example, in the lower multilayer mirror 120, AlAs is used as low-refractive-index layers in some cases in order to improve a heat dissipation property. In this case, since AlAs is easily oxidized, the etching of the second trench structure 240 may be stopped at a position where AlAs of the lower multilayer mirror 120 is not exposed.

Next, as shown in FIG. 4J, the photoresist 330 remaining on the second dielectric layer (protective film 320) is removed. The photoresist 330 is removed by, for example, asking using oxygen plasma.

Next, as shown in FIG. 4K, the second oxidizable layer 260 is oxidized from an exposed sidewall in the second trench structure 240, thus forming the second insulating region 224. The oxidation is conducted by heating the substrate to, for example, 400° C. and exposing the substrate to water vapor.

The first oxidizable layer 250 has already been oxidized. Therefore, even when the first oxidizable layer 250 is heated and exposed to water vapor in this step, oxidation of the first oxidizable layer 250 does not significantly proceed.

However, in order to further suppress the oxidation of the first oxidizable layer 250, the substrate heating temperature in the oxidation of the second oxidizable layer 260 is preferably lower than that in the oxidation of the first oxidizable layer 250. For this purpose, the Al composition ratio of the second oxidizable layer 260 is preferably higher than the Al composition ratio of the first oxidizable layer 250. Alternatively, the thickness of the second oxidizable layer 260 is preferably larger than the thickness of the first oxidizable layer 250. Furthermore, in order to achieve the desired levels of oxidation in the first and second oxidizable layers (250 and 260, respectively), both the adjustment of the Al composition ratio and the adjustment of the thickness may be performed.

As described above, once the first oxidizable layer 250 is oxidized, the oxidation of the first oxidizable layer 250 does not significantly proceed. Therefore, the Al composition ratio of the second oxidizable layer 260 may be lower than the Al composition ratio of the first oxidizable layer 250. Also, the thickness of the second oxidizable layer 260 may be smaller than that of the first oxidizable layer 250.

An unoxidized region, i.e., the second electrically conductive region 222 is left at the central portion of the second oxidizable layer 260. The second electrically conductive region 222 has, for example, a circular shape having a diameter of 6 μm, a square shape having a side of 6 μm, or an intermediate shape therebetween. In this case, the distance between the inner circumference of the second trench structure 240 and the boundary (oxidation front) between the second electrically conductive region 222 and the second insulating region 224 is 10.5 μm. That is, the oxidation distance is 10.5 μm.

Note that the shape of an electrically conductive region formed by oxidizing an AlGaAs layer has significant anisotropy with an increase in the Al composition ratio or with a decrease in the oxidation temperature. For example, in an AlGaAs layer formed on a GaAs substrate with (100) crystallographic orientation, oxidation occurs slowly in the [011],

[01-1], [0-11], and [0-1-1] directions, and oxidation occurs rapidly in the [001], [00-1], [010], [0-10] directions. Note that the notation "(100)" refers to a crystal orientation in which the vector 1x+0y+0z, or its equivalent, is perpendicular to the surface of the crystal, while the notation [110] refers to a direction parallel to the vector 1x+1y+0z, or its equivalent.

Figure 4L:
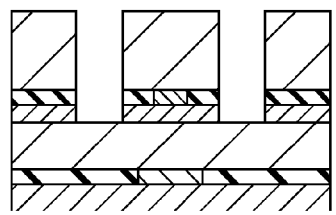

Next, as shown in FIG. 4L, the remaining first dielectric layer 300 and protective film 320 are removed by using, for example, buffered hydrogen fluoride.

Figure 5M:
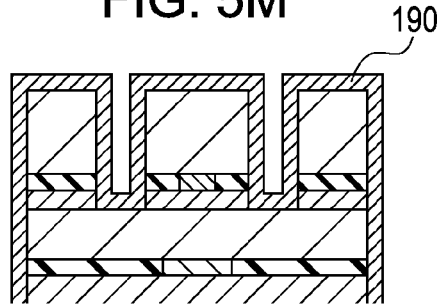
FIGS. 5M to 5P are schematic views each showing the method for producing the surface emitting laser according to the first embodiment.

Next, as shown in FIG. 5M, an insulating film 190 is deposited over the entire surface. The insulating film 190 is a third dielectric layer having an optical thickness of, for example, $\lambda/2$ and is composed of, for example, silicon oxide. The insulating film 190 is deposited by, for example, plasma CVD.

Figure 5N:
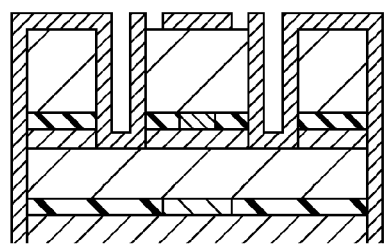

Next, as shown in FIG. 5N, a photoresist (not shown) is applied, and patterning exposure and development for removing a part of the insulating film 190 are then conducted, so that an upper electrode 170 to be formed later is brought into contact with a semiconductor contact layer. Next, the part of the insulating film 190 is removed using this photoresist as a mask. The photoresist is then removed. The upper electrode 170 contacts the semiconductor contact layer on the inside of the first trench structure 230. The insulating film 190 is provided inside the first trench structure 230. Note that the first trench structure 230 may be filled with, for example, a non-conductive resin prior to this step.

Figure 5O:
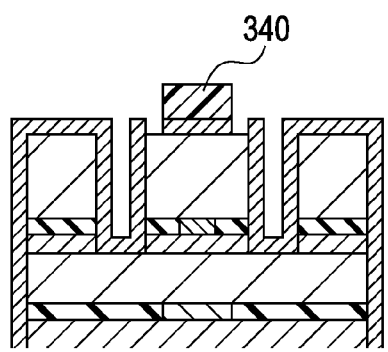

Next, as shown in FIG. 5O, a photoresist 340 for lift-off is applied. A patterning for forming the upper electrode 170 by a lift-off method is conducted to form a resist pattern for lift-off.

Figure 5P:
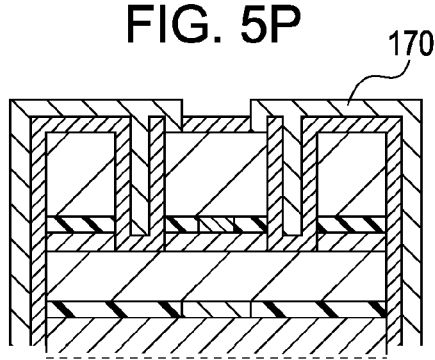

Subsequently, as shown in FIG. 5P, the upper electrode 170 is deposited by, for example, electron-beam vapor deposition and formed by the lift-off method. The upper electrode 170 is composed of, for example, Ti/Au.

The upper electrode 170 has, for example, a ring shape having an opening at the center thereof. The size of the opening is made to be larger than the size of the first electrically conductive region 212 so that the emitted laser beam is not significantly interfered by the ring shape of the upper electrode 170. The size of the opening may be larger than or smaller than the size of the second electrically conductive region 222. When the size of the opening is smaller than that of the second electrically conductive region 222, the upper electrode 170 overlaps with a part of the circumferential side of the light-emitting region. The upper electrode 170 overlaps with the distribution of the light intensity of higher-order modes more widely than the distribution of the light intensity of the fundamental mode. Therefore, when the upper electrode 170 brings optical loss, such as a scattering effect, to the respective modes, the upper electrode 170 has an effect of suppressing the higher-order modes more significantly.

Lastly, a lower electrode 180 is formed on the reverse face of the substrate 110 by, for example, resistance-heating vapor deposition. The lower electrode 180 is, for example, AuGe/Au.

The process described above is a self-alignment process in which the alignment of the first trench structure 230 and the alignment of the second trench structure 240 are conducted at the same time. In addition, the above process is a process in which oxidation of the first oxidizable layer 250 and oxidation of the second oxidizable layer 260 are conducted at different timings.

However, in the present invention, the self-alignment process need not be necessarily performed. Specifically, after the formation of the first trench structure 230, the second trench structure 240 may be formed by another patterning. Alternatively, after the formation of the second trench structure 240, the first trench structure 230 may be formed. In such cases, an accurate relative alignment of the two trench structures is necessary.

Alternatively, the oxidation of the first oxidizable layer 250 and the oxidation of the second oxidizable layer 260 may be performed at the same time instead of separately. In this case, during the wafer growth, it is necessary to accurately control the compositions and the thicknesses of the first oxidizable layer 250 and the second oxidizable layer 260. Furthermore, the repeatability of etching anisotropy in dry etching of a semiconductor is also necessary.

Figure 6:
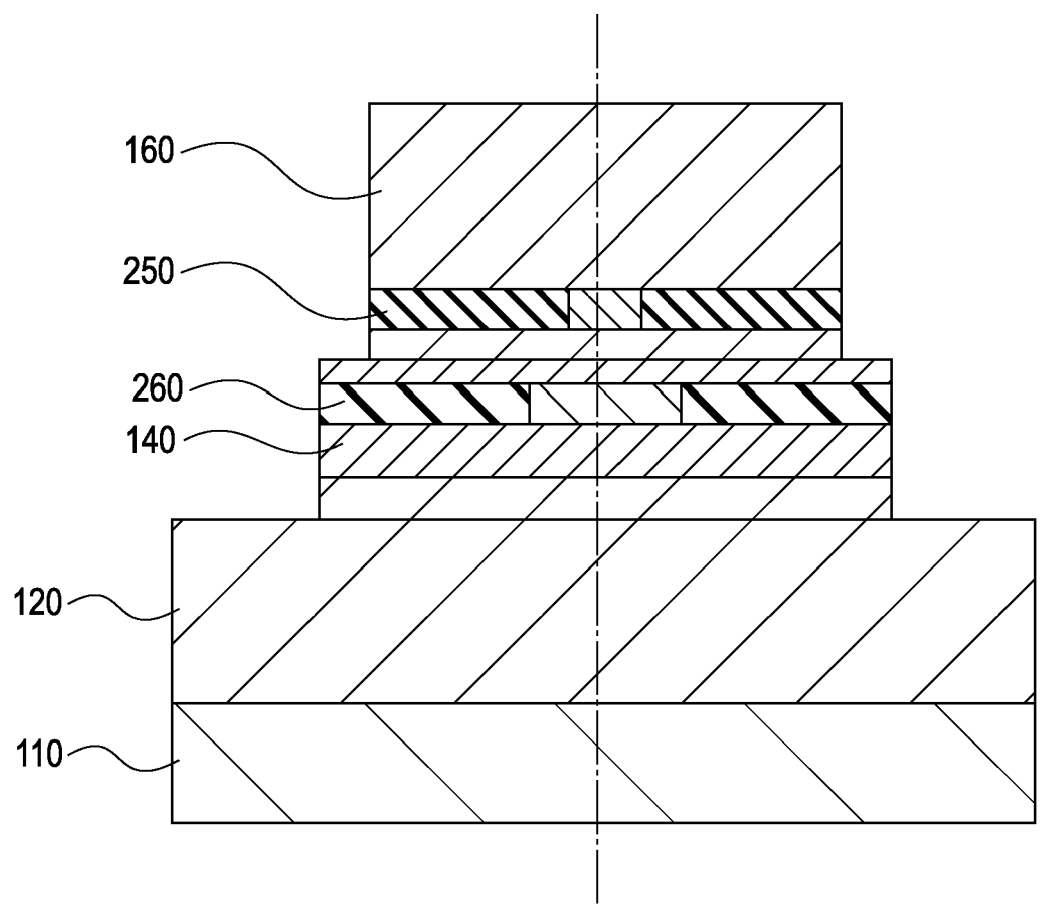
FIG. 6 is a view serving as a reference for explaining a feature of the first embodiment.

For the purpose of merely reducing the oxidation distance of the first current confinement layer 210, as shown in FIG. 6, a method is also conceivable in which a step-type second trench structure 240 is formed without providing the first trench structure 230. However, this structure has the following three problems.

(1) Decrease in Contact Property of Upper Electrode

In general, the upper electrode is composed of a metal and is formed on a semiconductor mesa and an insulating film by electron-beam vapor deposition, resistance-heating vapor deposition, or the like. In the step-type trench structure, the area of the top surface of the upper multilayer mirror 160 on which the upper electrode can be deposited is reduced. The upper electrode is not readily deposited on sidewalls of the mesa or step-like surfaces. In this case, the upper electrode tends to be detached. In addition, since an ohmic junction is established in a contact portion between the electrode and a semiconductor layer, a layer, such as a GaAs layer, having a high electrical conductivity is provided as a contact layer on the semiconductor side. Since such a layer having a high electrical conductivity often has a large optical absorption, the contact layer is preferably arranged away from the active layer 140 as much as possible in a vertical cavity surface emitting laser. More preferably, the contact layer is arranged on the top surface of the upper multilayer mirror 160. As a result, in the step-type trench structure, sufficient contact cannot be established between the upper electrode 170 and the semiconductor layer, and a Schottky junction may be formed.

(2) Decrease in Heat Dissipation Property

In the step-type trench structure, as illustrated in FIG. 6, a large volume of the upper multilayer mirror 160 cannot be ensured, as compared with the embodiment of FIG. 1A of the present invention. As a result, heat generated from the active layer 140 and the upper multilayer mirror 160 tends to accumulate. Consequently, since the temperature of the active layer 140 increases, the output decreases, and the reliability of the device may be negatively affected.

(3) Difficulty in Production Method

It is difficult to form the step-type trench structure by etching. It is particularly difficult to accurately and relatively align the boundaries between portions having different heights. Consequently, the centers of electrically conductive regions are shifted as shown in FIG. 6, and it is very difficult to obtain a single transverse mode.

In contrast, the structure illustrated in FIG. 1A of the first embodiment can be easily produced because each of the trench structures can be satisfactorily formed by normal etching. Furthermore, since the multilayer mirror is present between the first trench structure 230 and the second trench structure 240, a self-alignment process can be performed as described above. Accordingly, the shift between the center of the first electrically conductive region 212 and the center of the second electrically conductive region 222 does not tend to occur.

In particular, red-wavelength-band surface emitting lasers include the following three features, as compared with infrared-wavelength-band surface emitting lasers.

(1) In the red wavelength band, GaAs used as a contact layer has a large optical absorption.
(2) In an AlGaInP-based active layer, a carrier overflow readily occurs and heat generation is significant.
(3) Because of the short wavelength, it is necessary to reduce the scale of the device in order to obtain a single transverse mode, and thus the alignment of the current confinement layer is difficult.

Accordingly, at least one embodiment of the present invention can be suitably used in such red-wavelength-band surface emitting lasers.

Although problems of the step-type trench structure have been pointed out in the above description, the step-type trench structure can also be used, as long as these problems do not cause adverse effects in practical use.

Next, a proposed design guideline for forming a current confinement layer will be described.

The first current confinement layer 210 and the second current confinement layer 220 control the distribution of carriers flowing to the active layer 140. The shape and the area of the electrically conductive region in the in-plane direction of the substrate of each of the first and second current confinement layers are considered as the primary parameters.

Figure 11:
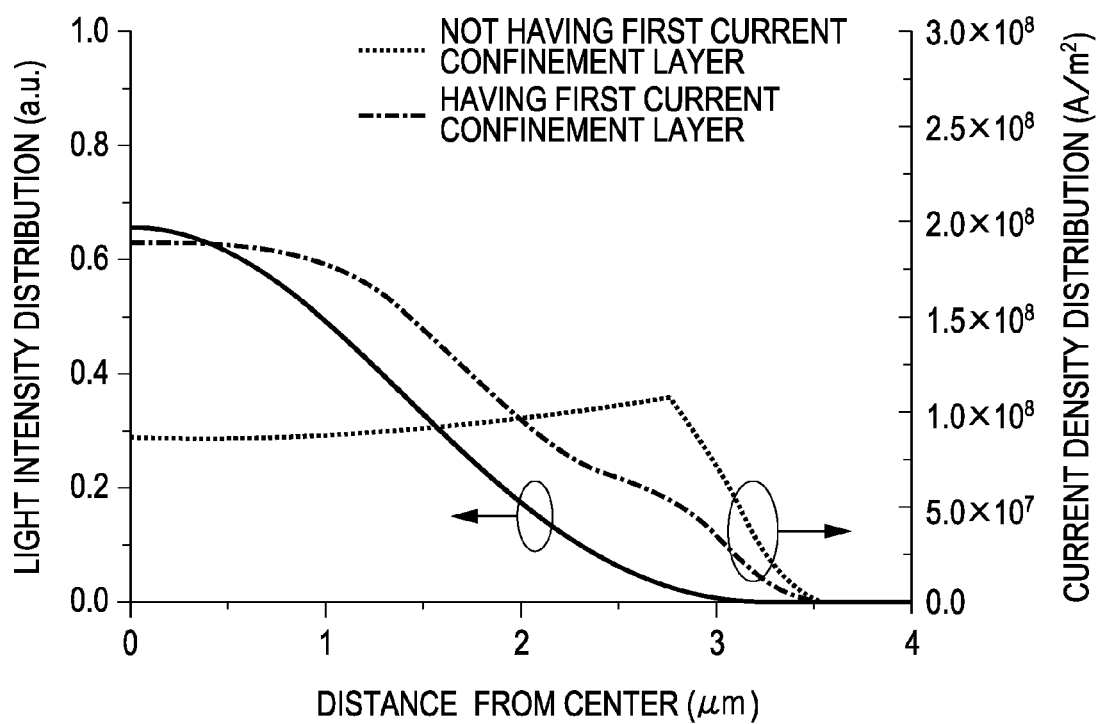
FIG. 11 is a graph for explaining a feature of the first embodiment.
Figure 12:
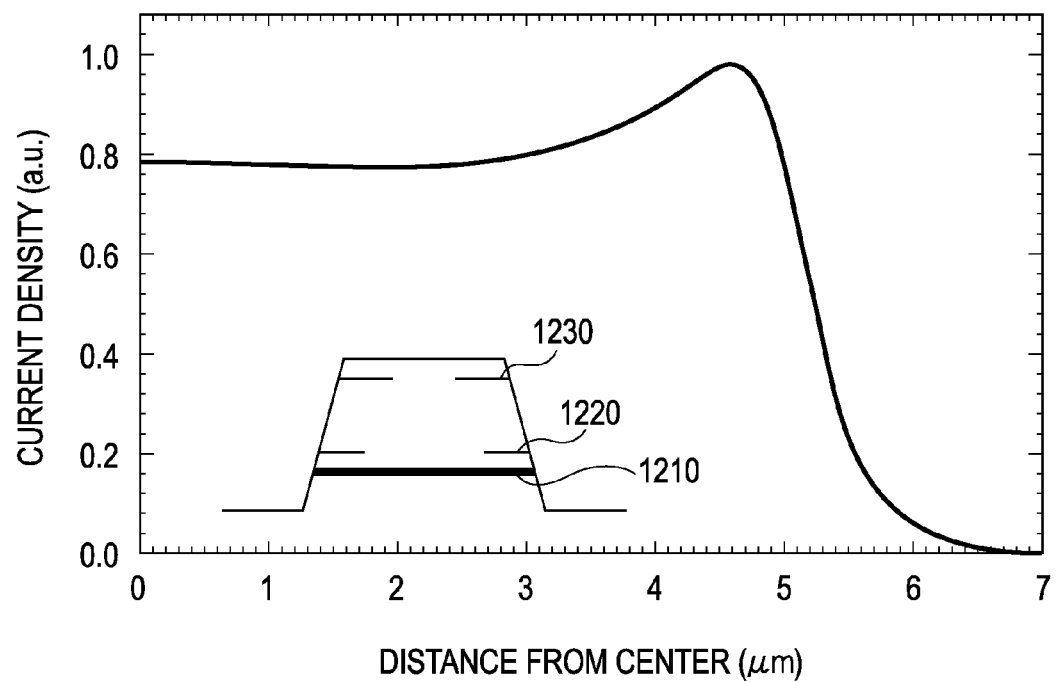
FIG. 12 includes a graph and a view illustrating the related art.

FIG. 11 shows a calculation example of such parameter. FIG. 11 is a plot of the light intensity distribution of the fundamental mode of a surface emitting laser, and the current density distributions near an active layer. The horizontal axis of FIG. 11 represents the distance from the center of the optical axis in the in-plane direction of a substrate.

It is assumed that the surface emitting laser includes a second current confinement layer 220 formed by oxidation and disposed directly on an upper spacer layer. It is assumed that the second electrically conductive region 222 has a circular shape having a diameter of 6 µm. Based on the foregoing premises, as shown in FIG. 11, the light intensity distribution of the fundamental mode shows a profile close to the Gaussian distribution (solid line) in a light-emitting region having a size substantially the same as the second electrically conductive region 222.

FIG. 11 shows the current density distributions in the case where the surface emitting laser does not include a first current confinement layer 210 (dotted line), and the case where the surface emitting laser includes a first current confinement layer 210 (dot-dashed line). The total of the current in each of the cases is assumed to be 3 mA. As for the case where the first current confinement layer 210 is provided, it is assumed that the first electrically conductive region 212 thereof is disposed 0.4 µm above the second current confinement layer 220, that the first current confinement layer 210 has a circular shape having a diameter of 3 µm, and that the center of the circular shape coincides with the center of the second electrically conductive region 222.

When the surface emitting laser does not include the first current confinement layer 210, the current is confined only by the second current confinement layer 220, and thus the current density distribution is large in the peripheral portion of the second electrically conductive region 222. Consequently, the gain of a higher-order mode increases, and it is difficult to obtain a single transverse mode.

In contrast, when the surface emitting laser includes the first current confinement layer 210 having the first electrically conductive region 212, the area of which is smaller than that of the second electrically conductive region 222, the current density distribution is large at the center of the second electrically conductive region 222 because the current has been confined by the first current confinement layer 210.

Accordingly, the current density distribution of the surface emitting laser having the first current confinement layer 210 with the first electrically conductive region 212 and the second current confinement layer 220 with the second electrically conductive region 222 becomes close to the light intensity distribution of the fundamental mode to efficiently excite the fundamental mode. Thus, an effect of a single transverse mode can be obtained.

The first electrically conductive region 212 may have a shape closer to a perfect circle than the second electrically conductive region 222 because the overlapping of the carrier distribution in the active layer 140 with the fundamental mode becomes larger than that in the reverse case. This is because, as understood from FIG. 11, the carrier distribution in the active layer 140 is significantly affected by the first electrically conductive region 212 having a smaller area.

In general, with an increase in the Al composition ratio of an AlGaAs layer, the dependency of the oxidation rate on the crystal orientation increases.

Accordingly, when the sidewall inside a trench structure of the device has, for example, a circular shape or a circular arc shape, the Al composition ratio of the first oxidizable layer 250 is preferably the same as or lower than the Al composition ratio of the second oxidizable layer 260.

Carriers passing through the first current confinement layer 210 diffuse in the transverse direction as the carriers approach the active layer 140. Accordingly, in order to obtain the effect of the operation in a single transverse mode, the size of the first electrically conductive region 212 must be reduced as the first current confinement layer 210 is disposed away from the active layer 140. However, when the size of the first electrically conductive region 212 is reduced, the electrical resistance of the device increases accordingly.

When the distance between the first electrically conductive region 212 and the second electrically conductive region 222 is too small, it is difficult to form the first trench structure 230. The reason for this is as follows. If the first trench structure 230 reaches the second electrically conductive region 222, the second electrically conductive region 222 is also oxidized from a sidewall of the first trench structure 230 during the formation of the first current confinement layer 210, which is not desirable.

On the other hand, with an increase in the distance between the first electrically conductive region 212 and the second electrically conductive region 222, carriers passing through the first electrically conductive region 212 readily diffuse in the in-plane direction of the substrate until the carriers reach the second electrically conductive region 222. Therefore, the carrier distribution profile in the second electrically conductive region 222 does not depend on the size of the first electrically conductive region 212.

Note that, by adjusting the doping concentration or the material thickness of a multilayer mirror region between the first electrically conductive region 212 and the second electrically conductive region 222, the electrical conductivity of the multilayer mirror region can be adjusted, thus controlling the above-mentioned diffusion of the carriers.

In the multilayer mirror between the first current confinement layer 210 and the second current confinement layer 220, in order to suppress the diffusion of carriers in the horizontal direction, the hetero-barrier of the multilayer mirror is reduced as much as possible. In this case, the multilayer mirror may be composed of a graded multilayer film.

The size and the position of the first electrically conductive region 212 can be optimized in consideration of the conditions described above. For example, the diameter of the first electrically conductive region 212 is a half of the diameter of the second electrically conductive region 222. The distance between the first electrically conductive region 212 and the second electrically conductive region 222 is, for example, 0.2 μm or more and 1 μm or less.

In addition, the current density in the first electrically conductive region 212 is higher than that in the second electrically conductive region 222. Accordingly, from the standpoint of reliability, the thickness of the first oxidizable layer 250 is preferably smaller than the thickness of the second oxidizable layer 260. This is because, with an increase in the thickness of an oxidizable layer, a larger stress is applied to an oxidation front of the oxidizable layer by a contraction in volume when the layer is oxidized.

Furthermore, the thicknesses and the positions of the first current confinement layer 210 and the second current confinement layer 220 can be determined also in consideration of the viewpoint of optical characteristics.

When an AlGaAs layer functioning as an oxidizable layer is oxidized in a high-temperature water vapor, the refractive index of the layer significantly decreases. For example, the refractive index of AlAs to light of $\lambda=680$ nm is about 3. After AlAs is oxidized, the refractive index thereof decreases to about 1.4 to 1.8.

Accordingly, with an increase in the thickness of the oxidizable layer, an optical influence on the laser cavity increases after the layer is oxidized. Furthermore, when an oxidized layer is disposed at an antinode of the intensity distribution of resonant light of a surface-emitting laser cavity, the influence on the laser cavity is large, as compared with the case where the oxidized layer is disposed at a node of the intensity distribution thereof.

The second current confinement layer 220 provided near the active layer 140 significantly affects the profile of the resonant light mode of the surface emitting laser 100 according to an embodiment of the present invention. In order to reduce the optical influence caused by the first current confinement layer 210, the thickness of the first oxidizable layer 250 is reduced and/or the first oxidizable layer 250 is disposed at a node of the intensity distribution of resonant light.

On the other hand, the optical influence caused by the first current confinement layer 210 can be brought to the resonant mode by adopting a configuration reverse to the above. For example, the surface emitting laser 100 can be designed so that, by oxidizing the first oxidizable layer 250, the reflectivity of the upper multilayer mirror 160 of a region including the oxidized portion is decreased. Specifically, the first oxidizable layer 250 is formed in a high-refractive-index portion of the upper multilayer mirror 160. When this first oxidizable layer 250 is oxidized, the reflectivity of the multilayer mirror is decreased. A portion where the light intensity distribution of the higher-order mode overlaps with the first insulating region 214 is larger than a portion where the light intensity distribution of the fundamental mode overlaps with the first insulating region 214. Accordingly, in this case, the first current confinement layer 210 provides larger reflection loss to the higher-order mode. That is, the first current confinement layer 210 suppresses the higher-order mode in terms of not only the shaping effect of the carrier distribution but also an optical aspect, thus achieving an operation in a single transverse mode.

Second Embodiment

Figure 7A:
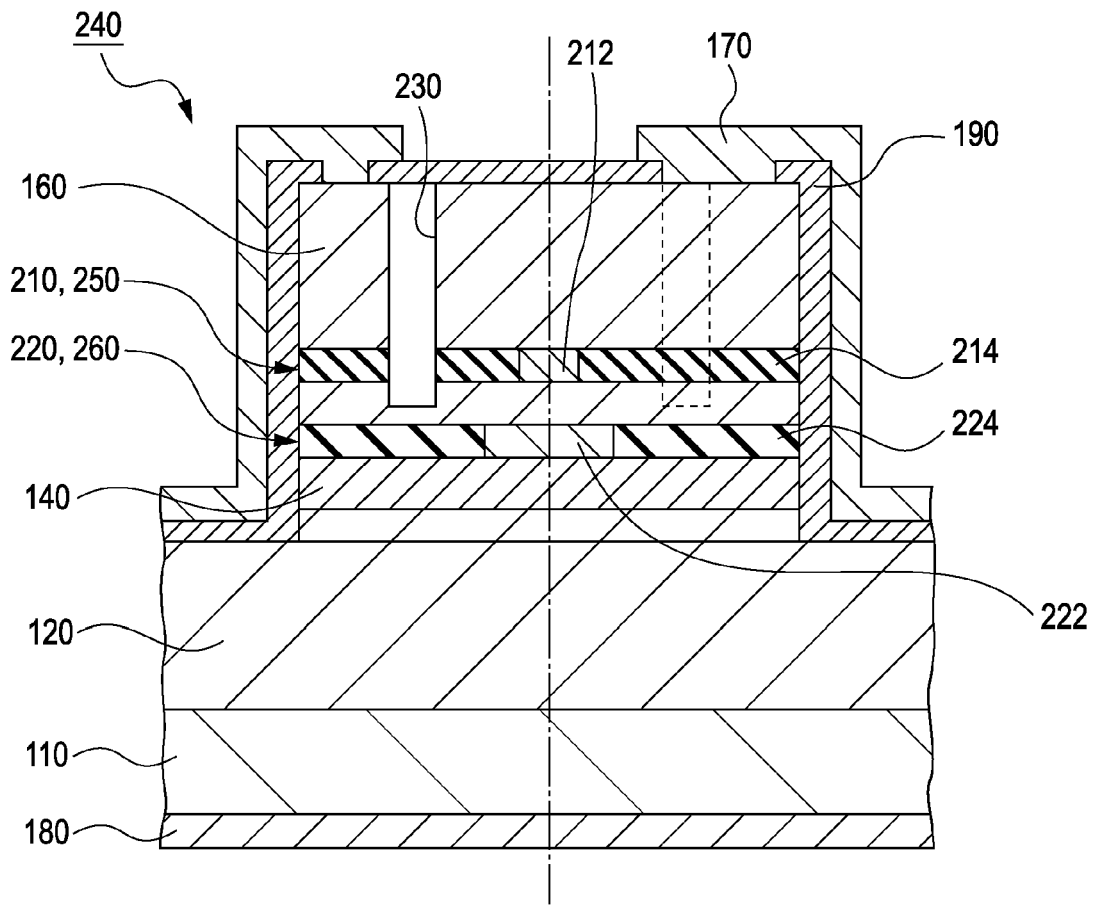
FIGS. 7A and 7B are schematic views each showing a surface emitting laser according to a second embodiment.
Figure 7B:
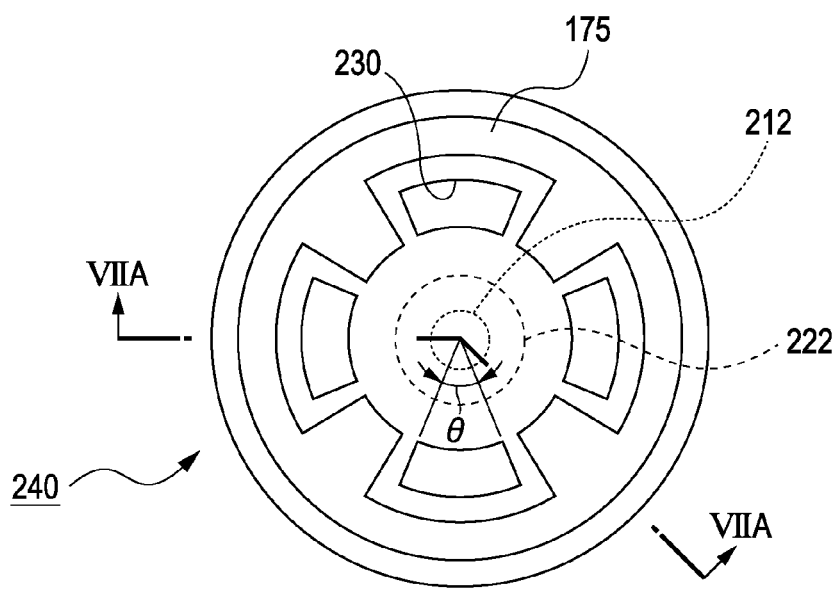

FIG. 7A is a schematic cross-sectional view of a surface emitting laser according to a second embodiment of the present invention, and FIG. 7B is a schematic top view of the surface emitting laser according to the second embodiment of the present invention. Specifically, FIG. 7A is a cross-sectional view taken along line VIIA-VIIA in FIG. 7B. Components that are common to those in the first embodiment are assigned the same reference numerals shown in FIGS. 1A to 6; thus, repetitive description thereof may be omitted.

A feature of the second embodiment is that a first trench structure 230 is divided into a plurality of portions. Therefore, carriers can flow into a first electrically conductive region 212 also from a region located above a first current confinement layer 210 and outside the first trench structure 230 when viewed from the central portion of an upper multilayer mirror 160 of the device. Accordingly, as shown in FIG. 7B, a contact region 175 can be formed even outside of the first trench structure 230. Here, the term "contact region 175" refers to a region where an upper electrode 170 contacts a contact layer on the upper multilayer mirror 160. In this embodiment, since the first trench structure 230 is formed in a divided manner, the area of the contact region 175 can be increased compared with the structure of the first embodiment. Consequently, the upper electrode 170 and the semiconductor can contact each other with a lower resistance. In addition, the production process becomes easier than the first embodiment because a large margin can be ensured in a patterning step of partially etching an insulating film and a step of forming a lift-off pattern of the upper electrode 170.

Furthermore, the surface emitting laser of this embodiment is excellent also in terms of the heat dissipation property because a large volume of the upper multilayer mirror remains as compared with the first embodiment.

When the contact between the upper electrode 170 and the semiconductor is present also outside the first trench structure 230 as in this embodiment, preferably, an unoxidized region other than the first electrically conductive region 212 is not formed in the first oxidizable layer 250. That is, in this embodiment, a plurality of portions of the first trench structure 230 are arranged so as to satisfy this condition.

Herein, the minimum distance between a sidewall of the first trench structure 230 and the first electrically conductive region 212 (the oxidation distance in oxidation of the first oxidizable layer 250) is defined as a first oxidation distance. In order to satisfy the above condition, the distance between each point of the first oxidizable layer 250, the point being other than the first electrically conductive region 212, and a sidewall of the first trench structure 230 or a second trench structure 240 is preferably smaller than the first oxidation distance.

When the oxidation rate of the first oxidizable layer 250 is anisotropic, the portions of the first trench structure 230 may be arranged in a direction in which the oxidation rate becomes the minimum when viewed from the center of the device. Thus, the shape of the first electrically conductive region 212 can be close to a perfect circle. Furthermore, in this case, complete oxidation of the first oxidizable layer 250 other than the first electrically conductive region 212 can be more reliably performed, as compared with the case where the portions of the first trench structure 230 are not arranged in the above direction.

For example, when the first oxidizable layer 250 is an AlGaAs layer formed on a GaAs (100) substrate, the portions of the first trench structure 230 can be arranged in the [011], [01-1], [0-11], and [0-1-1] directions in which oxidation occurs slowly when viewed from the center of the device.

As for the shape and the size of the first trench structure 230, for example, as shown in FIG. 7B, the ring shape described in the first embodiment may be divided into sectors. When the central angle (θ in FIG. 7B) of the sector-shaped ring is increased, complete oxidation of the first oxidizable layer 250 other than the first electrically conductive region 212 can be easily performed. However, since the distance between the portions of the first trench structure 230 is decreased, the electrical resistance between the first electrically conductive region 212 and the upper electrode 170 located outside the first trench structure 230 increases.

In contrast, when the central angle of the sector-shaped ring is decreased, the phenomenon reverse to the above occurs. The angle θ can be varied and is, for example, 30°, 45°, or 60°. When the angle θ is small, the inner diameter of the first trench structure 230 is determined to be large such that the first oxidation distance can be as large as possible.

On the other hand, when the angle θ is large, the surface emitting laser is configured so that the contact region can be ensured inside the first trench structure 230 when viewed from the center of the device. For example, when the inner diameter (diameter) of the second trench structure 240 is 27 μm, the inner diameter (diameter) of the first trench structure 230 can be in the range of about 8 to 16 μm, and the angle θ can be, for example, in the range of about 60° to 30°.

Third Embodiment

Figure 8A:
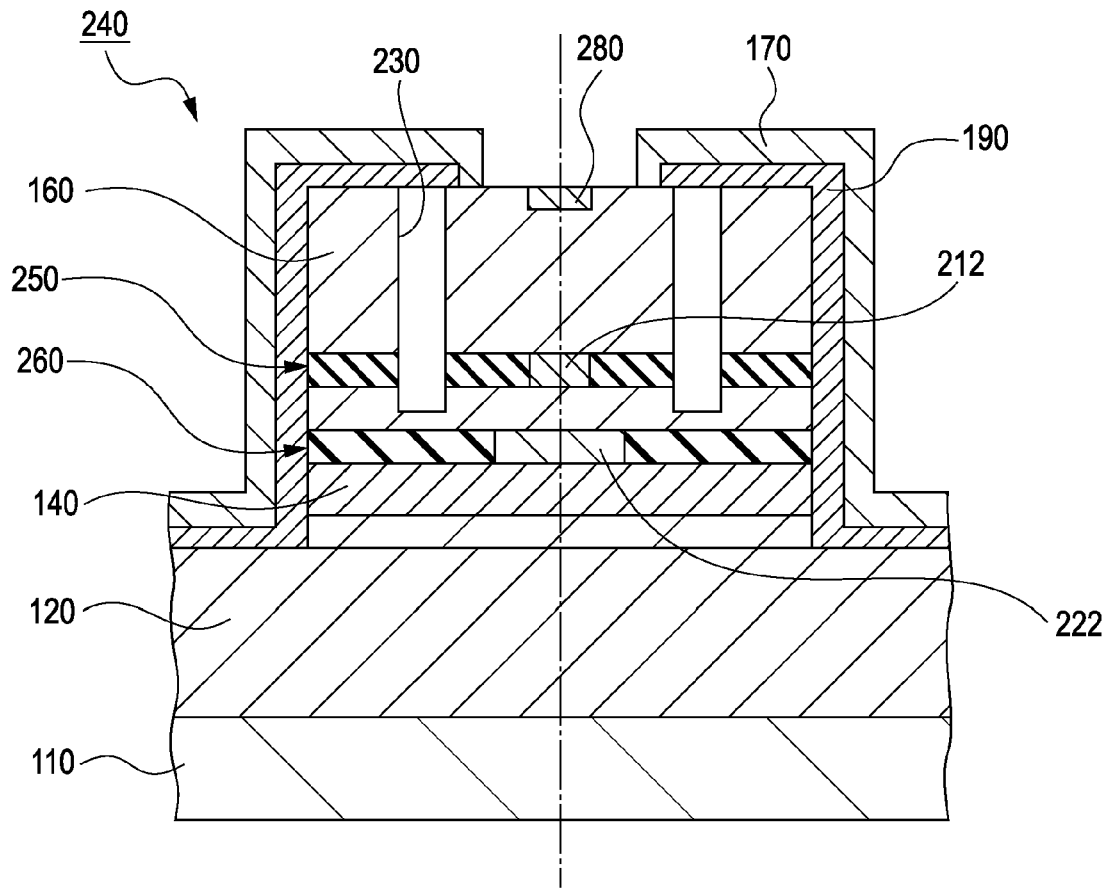
FIGS. 8A and 8B are schematic views each showing a surface emitting laser according to a third embodiment.
Figure 8B:
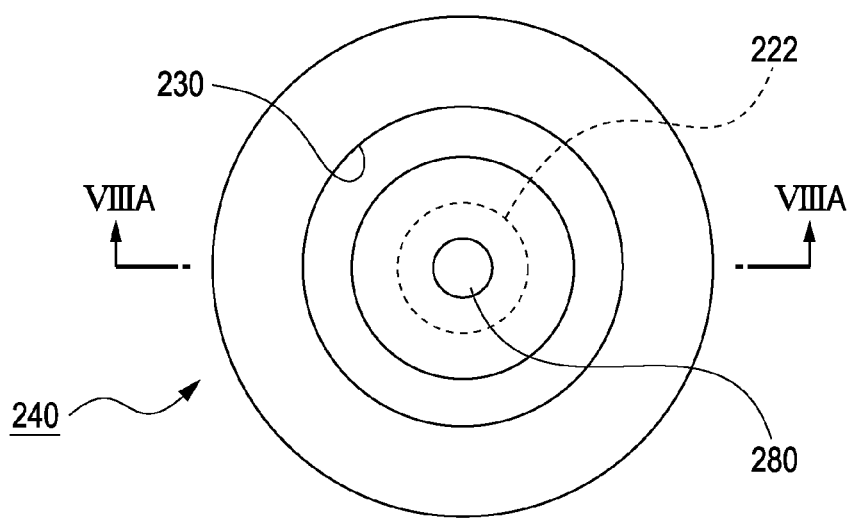

FIG. 8A is a schematic cross-sectional view of a surface emitting laser according to a third embodiment of the present invention. FIG. 8B is a schematic top view of the surface emitting laser according to the third embodiment of the present invention. Specifically, FIG. 8A is a cross-sectional view taken along line VIIIA-VIIIA in FIG. 8B.

As shown in FIGS. 8A and 8B, a third trench structure 280 can be provided on an emission aperture of the surface emitting laser of the first embodiment or the second embodiment. In FIG. 8B, a first electrically conductive region 212 is omitted for simplicity.

The third trench structure 280 has a function of providing an in-plane distribution of the reflectivity of an upper multilayer mirror 160, viewed from the active layer side, in a light-emitting region (specifically, in a second electrically conductive region 222). For this purpose, the third trench structure 280 is arranged inside the second electrically conductive region 222 in the in-plane direction of a substrate.

For example, when the second electrically conductive region 222 has a circular shape having a diameter of 6 μm, the third trench structure 280 is formed so that a high-reflectivity portion having a diameter of 3 μm and a peripheral low-reflectivity portion are formed in the circle.

For example, regarding a multilayer mirror including layers each having an optical thickness of λ/4, where λ represents the wavelength, each time the multilayer mirror is etched, the reflectivity changes with a period of λ/2 with respect to the depth (optical path) thereof.

For example, in an upper multilayer mirror 160 terminated with a low-refractive-index layer on the light-emitting side, the third trench structure 280 is formed by etching a circular portion of the upper multilayer mirror 160 by an optical path of λ/4, the circular portion having a diameter of 3 μm and the center of a light-emitting region as the center. In contrast, in an upper multilayer mirror 160 terminated with a high-refractive-index layer on the light-emitting side, the third trench structure 280 is formed by etching the upper multilayer mirror 160 by an optical path of λ/4 so that a circular portion having a diameter of 3 μm and the center of a light-emitting region as the center thereof remains.

By providing an in-plane distribution of the reflectivity as described above, the reflection loss of the higher-order mode becomes larger than the reflection loss of the fundamental mode. Consequently, even when a current larger than that in the first embodiment is supplied, the effect of the operation in a single transverse mode can be obtained.

Next, a self-alignment process in which the central axes of the first trench structure 230, the second trench structure 240, and the third trench structure 280 can be automatically aligned will be described as a production method of this embodiment. Note that, in order to perform this process, it is necessary that the third trench structure 280 be not connected to the first trench structure 230 or the second trench structure 240.

FIGS. 9A to 9F are schematic views each illustrating a method for producing the surface emitting laser according to this embodiment.

As in the first embodiment, a lower multilayer mirror 120, an active layer 140, and an upper multilayer mirror 160 are grown on a substrate wafer. As in the structure disclosed in the first embodiment, the upper multilayer mirror 160 includes a second oxidizable layer 260 and a first oxidizable layer 250. In addition, the upper multilayer mirror 160 of this embodiment is designed so that the reflectivity becomes the maximum when the upper multilayer mirror 160 is etched from the light-emitting side by an optical path of about λ/4.

A semiconductor process shown in FIGS. 9A to 9F is conducted on the upper multilayer mirror 160 of the grown wafer. The process described below is a self-alignment process in which the alignment of the first trench structure 230, that of the second trench structure 240, and that of the third trench structure 280 are performed at the same time.

Figure 9A:
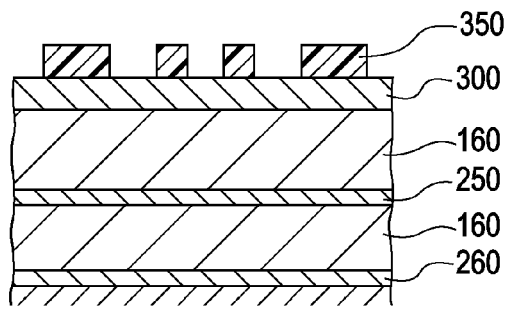
FIGS. 9A to 9F are schematic views each showing a method for producing the surface emitting laser according to the third embodiment.

First, as shown in FIG. 9A, a dielectric layer 300 functioning as a protective film is deposited on the upper multilayer mirror 160. The dielectric layer 300 is a $SiO_2$ layer having a thickness of, for example, 1 μm. For example, a plasma CVD method can be employed as a deposition method.

A photoresist 350 is applied onto the dielectric layer 300, and patterned and developed so that an opening pattern is formed at positions of the first trench structure 230, the second trench structure 240, and the third trench structure 280.

The first trench structure 230 has a concentric ring shape having, for example, an inner diameter of 14 μm and an outer diameter of 20 μm. The second trench structure 240 has, for example, an inner diameter of 27 μm. The outer diameter of the second trench structure 240 is, for example, 33 μm or more. The outer diameter of the second trench structure 240 is not shown in the figure. The third trench structure 280 has, for example, an inner diameter of 3 μm.

Figure 9D:
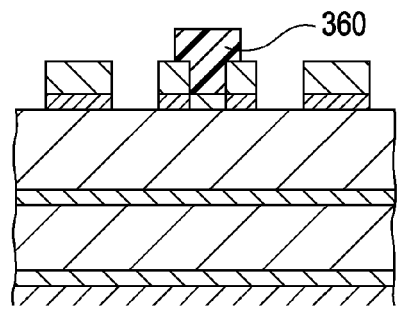
Figure 9B:
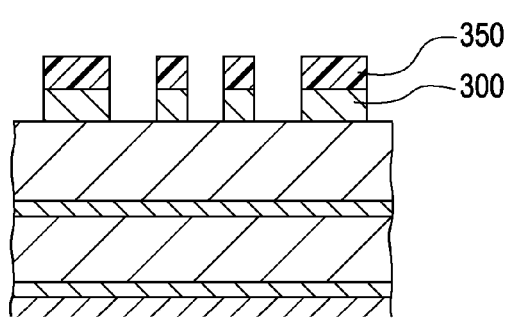

Next, as shown in FIG. 9B, the dielectric layer 300 is etched by, for example, wet etching with buffered hydrogen fluoride using the above-mentioned patterned resist as a mask.

Next, the photoresist 350 remaining on the dielectric layer 300 is removed. The photoresist 350 is removed by, for example, immersing in acetone.

Figure 9E:
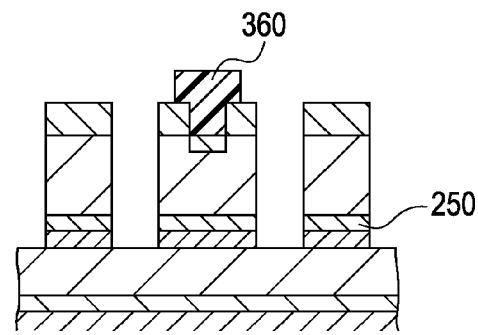
Figure 9C:
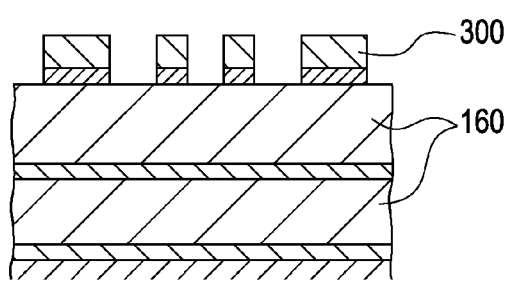

Next, as shown in FIG. 9C, a semiconductor layer is etched using the dielectric layer 300 as a mask. The etching is, for example, wet etching. When the semiconductor layer is composed of GaAs, for example, citric acid can be used as an etchant. When the semiconductor layer is composed of AlGaAs, for example, a mixed solution of phosphoric acid and aqueous hydrogen peroxide can be used as an etchant. The etching depth in this step is λ/4 in terms of the optical path. The upper multilayer mirror 160 is designed such that an AlGaAs layer (e.g., $Al_{0.90}Ga_{0.10}As$) having a high Al composition ratio is not exposed by this etching.

Next, a protective film (not shown) that is thinner than the protective film deposited in the previous step is deposited. The thin protective film is, for example, a $SiO_2$ film having a thickness of 100 nm.

Next, as shown in FIG. 9D, a photoresist 360 is applied, and patterning exposure and development are conducted so as to form a resist that completely covers the third trench structure 280 and that does not cover the first trench structure 230 and the second trench structure 240.

The above-mentioned thin protective film is etched using the photoresist 360 as a mask so that a semiconductor surface is exposed to the bottom of the first trench structure 230 and the second trench structure 240. The etching is conducted by, for example, immersing in buffered hydrogen fluoride for about one minute.

Next, as shown in FIG. 9E, the semiconductor layer is dry-etched using the photoresist 360 and the dielectric layer 300 to form the first trench structure 230 and the second trench structure 240. In this step, the etching is performed so that both the first trench structure 230 and the second trench structure 240 reach at least the top surface of the first oxidizable layer 250 and do not reach the top surface of the second oxidizable layer 260. The dry etching is conducted using, for example, plasma of $SiCl_4$ gas and Ar gas.

Figure 9F:
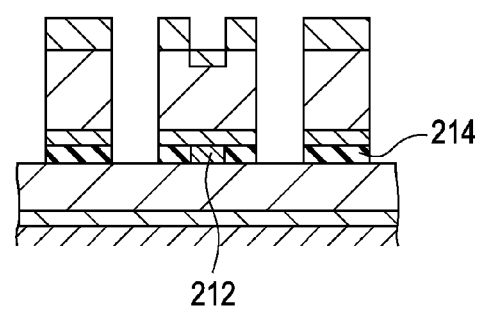

Next, as shown in FIG. 9F, the remaining resist is removed by ashing. The first oxidizable layer 250 is oxidized as in the first embodiment from the exposed sidewalls in the first trench structure 230 and the second trench structure 240 to form a first insulating region 214. The oxidation is conducted by, for example, heating the substrate to 450° C. and exposing the substrate to water vapor.

The subsequent steps are performed as in the self-alignment process (steps shown in FIG. 3F and the subsequent figures) disclosed in the first embodiment. In this case, the first trench structure 230 and the third trench structure 280 are processed in the same manner. Specifically, in the subsequent step of etching the second trench structure 240, the first trench structure 230 and the third trench structure 280 are masked with a resist. The diameter of the second electrically conductive region 222 is longer than the diameter of the third trench structure 280 and is 6 μm, for example.

Thus, the surface emitting laser shown in FIGS. 8A and 8B can be formed.

In this process, the relative positions of the second electrically conductive region 222, the first electrically conductive region 212, and the reflectivity distribution of the upper multilayer mirror 160 can be aligned. Accordingly, a surface emitting laser with a single transverse mode can be produced with a high yield.

Fourth Embodiment

A description will now be made of an image forming apparatus including a surface emitting laser array in which a plurality of surface emitting lasers described in any of the first to third embodiments are arranged.

Figure 10A:
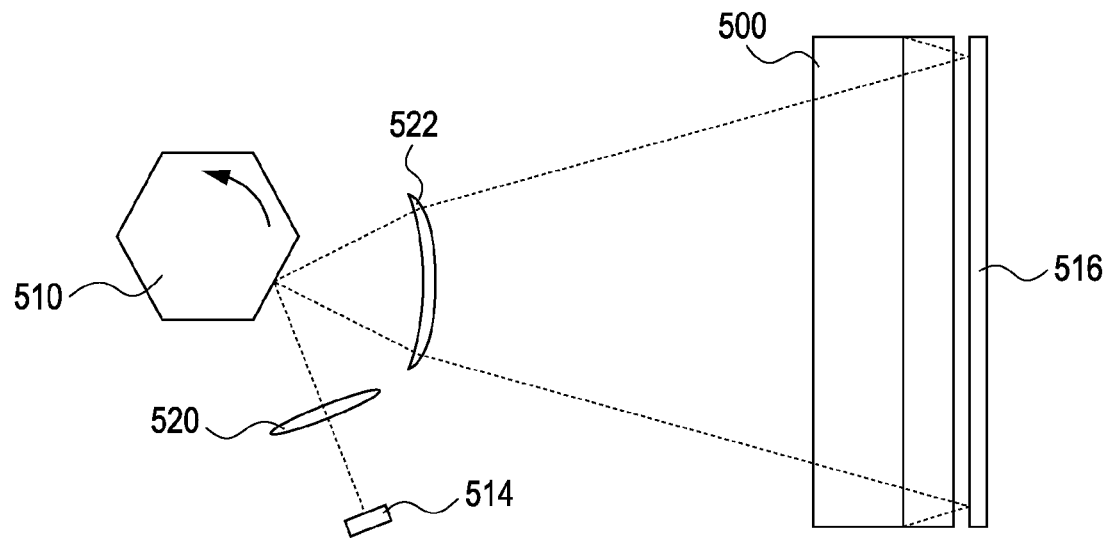
FIGS. 10A and 10B are schematic views each showing an image forming apparatus according to a fourth embodiment.
Figure 10B:
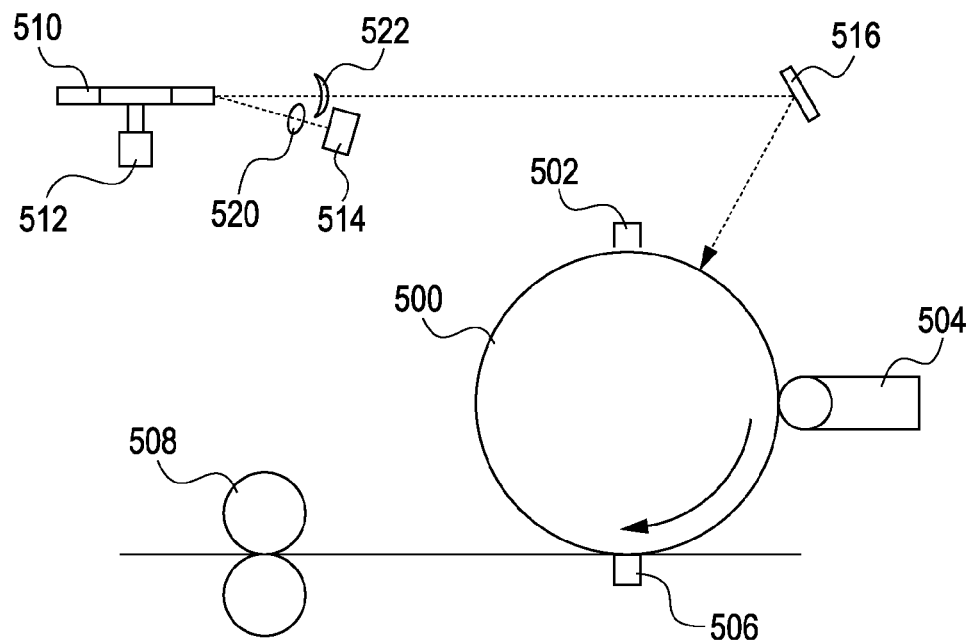

FIGS. 10A and 10B are views each showing the structure of an electrophotographic recording system image forming apparatus according to a fourth embodiment. FIG. 10A is a plan view of the image forming apparatus, and FIG. 10B is a side view thereof.

A surface emitting laser array 514 serves as a light source for recording and is configured to be turned on and off by an operation of a laser driver (not shown) in accordance with image signals.

Laser beams optically modulated in this manner are emitted from the surface emitting laser array 514 toward a rotatable polygon mirror 510 through a collimator lens 520. The rotatable polygon mirror 510 is rotated by a motor 512 in the direction indicated by the arrow in FIG. 10A, and the laser beams output from the surface emitting laser array 514 are reflected as deflected beams that continuously vary the emission angle on the reflection surfaces of the rotatable polygon mirror 510 with the rotation of the rotatable polygon mirror 510. The reflected beams are subjected to compensation for distortion aberration or the like by an fθ lens 522, applied to a photosensitive drum 500 (photosensitive member) through a reflecting mirror 516, and scanned on the photosensitive drum 500 in a main scanning direction. At this time, an image of a plurality of lines corresponding to the surface emitting laser array 514 is formed on the photosensitive drum 500 in the main scanning direction by the reflection of the laser beams on one surface of the rotatable polygon mirror 510. A 4×8 surface emitting laser array 514 is used in this embodiment, and thus an image of 32 lines is formed. The photosensitive drum 500 is charged in advance by a charger 502 and is sequentially exposed by the scanning of the laser beams to form an electrostatic latent image. The photosensitive drum 500 is rotated in the direction indicated by the circular arrow in FIG. 10B. The electrostatic latent image is developed by a developing device 504, and a developed visible image is transferred to transfer paper (not shown) by a transfer charger 506. The transfer paper, to which the visible image has been transferred, is conveyed to a fixing device 508 and discharged out of the apparatus after the fixing.

A 4×8 surface emitting laser array is used in this embodiment. However, the present invention is not limited thereto, and an m×n (m and n: natural numbers (except for 0)) surface emitting laser array may also be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method for producing a surface emitting laser including a substrate and a laminate disposed on the substrate, the laminate including a lower multilayer mirror, an active layer, and an upper multilayer mirror, the method comprising the steps of:

forming a second oxidizable layer in the laminate;

forming a first oxidizable layer in the laminate and above the second oxidizable layer;

forming a first trench structure so as to extend from the top surface of the upper multilayer mirror, to reach at least the top surface of the first oxidizable layer, and not to reach the top surface of the second oxidizable layer;

forming a first current confinement layer including a first electrically conductive region and a first insulating region by oxidizing the first oxidizable layer from a sidewall of the first oxidizable layer, the sidewall being exposed in the first trench structure;

forming a second trench structure so as to extend from the top surface of the upper multilayer mirror to reach at least the top surface of the second oxidizable layer; and forming a second current confinement layer including a second electrically conductive region and a second insulating region by oxidizing the second oxidizable layer from a sidewall of the second oxidizable layer, the sidewall being exposed in the second trench structure.

2. The method according to claim 1, wherein the step of forming the second current confinement layer is performed after the step of forming the first current confinement layer.

3. The method according to claim 1, wherein the step of forming the second trench structure includes a step of forming a trench structure so as not to reach the top surface of the second oxidizable layer, and a step of performing etching so as to extend from the bottom of the trench structure to reach at least the top surface of the second oxidizable layer.

4. The method according to claim 1, further comprising a step of:
   forming a third trench structure inside the first trench structure in an in-plane direction of the substrate by etching, the third trench structure being configured to control the reflectivity of the upper multilayer mirror.

5. The method according to claim 1, wherein the temperature in the oxidation of the second oxidizable layer is lower than the temperature in the oxidation of the first oxidizable layer.

* * * * *